United States Patent [19]

Fulkerson

[11] 3,970,866

[45] July 20, 1976

[54] LOGIC GATE CIRCUITS

[75] Inventor: David E. Fulkerson, Minnetonka, Minn.

[73] Assignee: Honeywell Inc., Minneapolis, Minn.

[22] Filed: Aug. 13, 1974

[21] Appl. No.: 497,018

[52] U.S. Cl. .............................. 307/218; 307/215; 307/299 A; 357/36; 357/86
[51] Int. Cl.² ................ H03K 19/08; H03K 19/22; H03K 19/34
[58] Field of Search ............... 307/215, 218, 299 A, 307/299 B; 357/36, 86

[56] References Cited

UNITED STATES PATENTS

| 3,233,125 | 2/1966 | Buie | 357/36 |
|---|---|---|---|
| 3,400,278 | 9/1968 | Walsh | 307/215 |
| 3,414,783 | 12/1968 | Moore | 307/215 X |
| 3,560,761 | 2/1971 | Kardash | 307/215 |
| 3,569,800 | 3/1971 | Collins | 357/40 |
| 3,571,616 | 3/1971 | Andrews | 307/215 |
| 3,629,610 | 12/1971 | Wilhelm | 307/218 |
| 3,638,048 | 1/1972 | Camerik | 307/299 A |
| 3,699,362 | 10/1972 | Jordan | 307/299 A |
| 3,751,680 | 8/1973 | Hodges | 357/86 |
| 3,769,524 | 10/1973 | Mathews | 307/215 |
| 3,790,817 | 2/1974 | Dobkin | 307/215 X |

OTHER PUBLICATIONS

Designing With TTL Integrated Circuits by IC Application Staff of Texas Instruments, Inc. p. 51, copyright 1971 McGraw–Hill Co.
Wiedmann—"Antisaturation Arrangement for Multiemitter Storage Cells," IBM Tech. Bulletin vol. 14, No. 6, 11/1971.

*Primary Examiner*—John S. Heyman
*Attorney, Agent, or Firm*—Theodore F. Neils

[57] ABSTRACT

A logic family is provided capable of accomplishing a logic function for each transistor used, i.e. one transistor per logic gate. A plurality of logic gate types are shown, each capable of a different logic function.

24 Claims, 9 Drawing Figures

LOGIC GATE CIRCUITS

BACKGROUND OF THE INVENTION

This invention relates to apparatus for providing logic circuits as logic gates to perform logical functions in combinational and sequential digital logic systems.

The advent of large scale integration has meant that monolithic integrated circuits are becoming available with more and more digital system functions provided therein to the point that substantial portions or all of a digital system are provided on a single chip. This increase in functional density and so in circuit density in a monolithic integrated circuit has several advantages. Substantial economies are realized in reduced assembly cost, etc. Improved reliability results because fewer interconnections need to be made among the devices making up the system. There is an increase in the rapidity of operation since signals which must be transmitted in the system can be transmitted over small distances.

These advantages and others motivate the desire to increase the number of logic gates in a monolithic integrated circuit device to further increase the logic function density in such a device. Additionally, to accomplish more rapidly the logic functions to be performed to thus improve the digital system capabilities, increasing the rapidity of operation of the logic gates used in a monolithic integrated circuit device is also very desirable. Yet, both increases in circuit density and in the rapidity of circuit switching operations tend to also increase the power dissipated in the monolithic integrated circuit device and so the method chosen to reach these two goals must also provide for achieving a sufficiently low power dissipation if a viable monolithic integrated circuit device is to be realized.

Currently, the need for rapidly operating digital monolithic integrated circuit devices is met most commonly by transistor-transistor logic circuits (TTL), particularly Schottky-clamped TTL, and emitter-coupled logic (ECL). The logic gates provided in these logic families tend to use on the average more than one transistor per logic function accomplished. Use of one transistor per basic logical function would be quite desirable since the use of further transistors tends to require more space in a monolithic integrated circuit, tends to slow operation of the logic gate and tends to increase power consumption.

There have been attempts to develop new logic circuits to improve on the foregoing logic circuit families and to develop new logic families. Among these is a logic circuit shown in U.S. Pat. No. 3,769,524 to Mathews which teaches use of a NOR gate to perform logical functions. The circuitry shown in this patent teaches a somewhat simplified logic gate requiring relatively little power but still shows use of more than one transistor on the average in achieving the NOR logic function provided.

SUMMARY OF THE INVENTION

The present invention uses either multiple base or multiple emitter bipolar transistors or both to provide a logic family capable of accomplishing a basic logical function with the use of one transistor. Use of such transistors to accomplish a basic logical function per transistor used conserves the number of circuit components required and, when provided in a monolithic integrated circuit, substantial savings in space used and improvements in switching rapidity also ensue. Both of these latter gains are due again to the use of a single transistor to perform the logic function involved. Further, these circuits in monolithic integrated circuit form faciliate logic gate layouts therein due to the convenient logic gate interconnections permitted. Also, the logic family of the present invention allows connection to logic gates in the TTL and ECL logic families with little difficulty and without requiring substantial additional circuitry.

DESCRIPTION OF THE PREFERRED EMBODIMENTS

Figure 1:
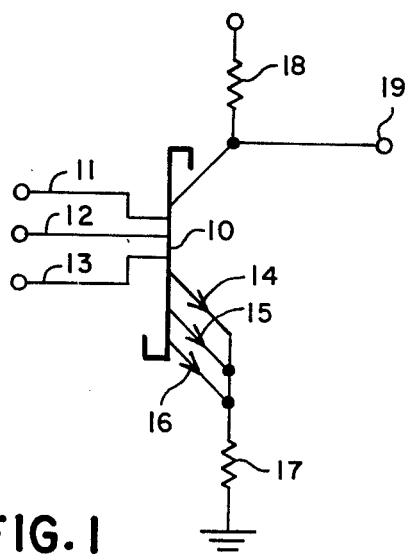
FIG. 1 shows an electrical schematic diagram of a portion of the present invention, a NOR gate.

FIG. 1 shows a circuit diagram for a logic gate for performing the NOR logical function which is constructed of a multiple base and multiple emitter bipolar transistor, 10, wherein an emitter is formed in each of several separate bases commonly provided in a collector region with these emitters internally shorted. Thus, effectively, a multiple base transistor is provided. A monolithic integrated circuit layout for a NOR gate including such a transistor is shown in a later drawing and the layout there is indicative of the construction of a discrete transistor having multiple bases and multiple emitters also.

Transistor 10 has three bases, bases 11, 12 and 13, and three corresponding emitters, emitters 14, 15 and 16. Bases 11, 12 and 13 serve as inputs to receive logic signals from a source of such signals such as another logic gate preceding the gate of FIG. 1.

An emitter resistor, 17, connected between the low value voltage supply terminal, shown in FIG. 1 as ground, and the emitter of transistor 10 is used to reduce "current-hogging" which occurs between the various base and emitter combinations present in transistor 10, i.e. base-emitter combination 11 and 14, base-emitter combination 12 and 15, and base-emitter combination 13 and 16. The use of resistor 17 reduces the current-hogging problem which plagued the old DCTL logic family but without the excessive use of space required by another solution to the DCTL problem which became the RTL logic family.

A load resistor, 18, connected between a terminal adapted for connection to the high value voltage supply and the collector of transistor 10, is used to provide a voltage swing at the NOR gate output, 19, in response to input signals at bases 11, 12 or 13. Transistor 10 is shown as a Schottky-clamped transistor, or Schottky transistor, which has a Schottky diode connected from each base to the collector (cathode connected to the collector) to keep transistor 10 out of saturation so as to increase its switching rapidity.

The logic gate of FIG. 1 provides a NOR logic function between the base inputs 11 through 13 and output 19. If base 11, 12 or 13 is in the high voltage value logic state, then transistor 10 is on and output 19 is in the low voltage value logic state. With bases 11–13 all in the low state, transistor 10 is in the off condition and a load on output 19 has voltage and current applied to it through load resistor 18, and output 19 is in the high state. As is well known, any Boolean logic function may be realized by the use of NOR gates alone.

This NOR gate has many advantages when compared with the gates of the TTL and ECL logic families. There are advantages also when compared with the NOR gate taught in the above referenced patent. The primary advantages follow from the use of a single transisotr to realize the entrie NOR logic function, i.e. a single collector region to contain the other transistor portions. The use of a single active device reduces space used in a monolithic integrated circuit in which the logic gate is to be provided to improve circuit density as compared with the use of two or more transistors to realize a logic function. The reduced size of the logic gate also means more rapid operation of the gate in switching from the low state to the high state or vice versa, in either monolithic integrated circuits or discrete devices. This is because the capacitance between the active devices and the substrate materials, usually silicon, is reduced by reducing the space taken up by whatever active devices are required to realize the logic functions.

Further, the NOR gate circuit of FIG. 1 can be operated at a substantially lower supply voltage than can either the standard TTL NAND gate or the standard ECL OR/NOR gate. This is due to the former circuit having but one $V_{BE}$ voltage drop occurring between the high voltage supply terminal and the low voltage supply terminal. The NOR gate circuit of FIG. 1 could operate at a supply voltage just exceeding 1 $V_{BE}$, but speed and power control dictate a somewhat higher voltage in practice. Use of a second type of gate circuit in the logic family of the present invention, as set out below, requires a supply voltage minimum of approximately 1½ $V_{BE}$, but again speed and power control lead to use of a somewhat higher voltage in practice.

The result of using a lower supply voltage compared to that used by another logic family, generally, is, first a lower voltage swing results which can increase the speed of the circuit since capacitances in the circuit need not be charged over as large a voltage swing. This potential improvement in operational rapidity may be nullified by voltage clamping due to the succeeding circuit connected to the output. Such clamping does occur among members of the logic family of the present invention as set out below. Secondly, the rapidity of operation of a logic gate is also increased, for a given gate power, when the voltage supplied to it is reduced since the current drive to charge the circuit capacitances can be increased without exceeding the given gate power.

A typical monolithic integrated circuit version of the logic circuit of FIG. 1 operated at a 2 volt supply voltage will have a power dissipation of 4 mw per gate and an average gate delay of less than a nanosecond. Resistor 17 in such a gate would be approximately 650 ohms while resistor 17 would be approximately 25 to 50 ohms.

Figure 2:
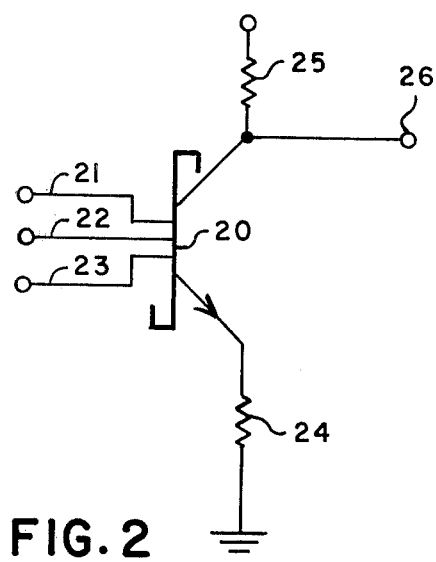
FIG. 2 shows an electrical schematic of a portion of the present invention, a NOR gate.

FIG. 2 shows the circuit diagram of another logic gate performing the NOR logical function using a multiple base, bipolar Schottky transistor, 20, having the multiple bases formed in a collector region common to them all and having a single emitter common to the multiple bases. The leads from the multiple bases are labeled 21, 22 and 23. Again, a resistor, 24, is used to limit current-hogging and a load resistor, 25, is used to provide a voltage swing at the output of the logic gate, 26.

The advantages of the NOR gate circuit shown in FIG. 2 are those of the NOR gate circuit shown in FIG. 1, but a transistor of even smaller physical size can be realized where but one emitter is used. For this kind of a transistor it is difficult to provide very many bases in the one transistor, i.e. a substantial fan-in, and some interaction occurs between the bases which must be controlled if the transistor is to be effectively a multiple base transistor. An example indicating a technique of providing a somewhat similar transistor is shown in U.S. Pat. No. 3,569,800 to Collins.

Figure 3:
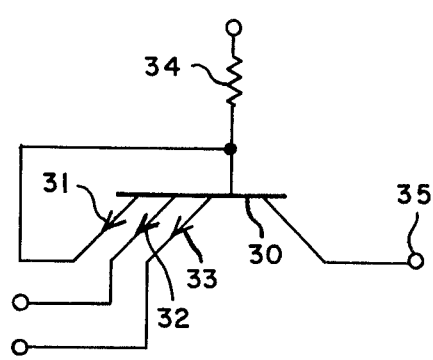
FIG. 3 shows an electrical schematic of a portion of the present invention, an AND gate.

As stated above, a NOR gate can perform all of the Boolean logic functions without any other type of logic gate being required. However, a logic gate performing another basic logical function can be useful if that particular logic function happens to be required in a digital system since only one logic gate is then needed to achieve this function rather than a combination of the preceding NOR gates. Hence, a further and compatible member of the logic family of the present invention has been found to be quite useful and is shown in FIG. 3, an AND gate. This gate, in addition, has some further advantages which will be set out below.

The logic gate shown in FIG. 3 to perform the AND logical function does so using a multiple emitter, bipolar transistor, 30, which has its multiple emitters formed in a single base region which in turn is formed in a collector region. The multiple emitters are labeled 31, 32 and 33. Emitter 31 is shorted internally to the base of transistor 30. Current is supplied to transistor 30 through a base resistor, 34, connected to a terminal adapted for connection to a voltage supply.

The AND logic function occurs between the inputs, which are emitters 32 and 33, and the output, 35, which is the collector lead of the transistor. When either or both emitter 32 and emitter 33 are in the low state, transistor 30 is in the "on" condition such that output 35 is also in the low state. When both emitter 32 and emitter 33 are in the high state, transistor 30 is in the "off" condition (actually transistor 30 is in the inverse transistor mode of operation) and the load to which output 35 is connected receives current and voltage through base resistor 34 and the base-collector junction of transistor 30, and output 35 is in the high state.

A difficulty with the NOR gates of the present invention described above is the relatively limited fan-out when other NOR gates are used as loads. This is due both to the current-hogging problem which exists to a degree even with the use of the emitter resistors in these gates and to the limited amount of current which these gates can source. Use of AND gates of the kind shown in FIG. 3 as the only kind of loads for the output of one of the above NOR gates can at least double the fan-out capabilities of the NOR gate. This improved fan-out is due to the relatively little current that each of these AND gates sinks (i) when at least one input emitter is in the high state and at least one other input emitter is in the low state, or (ii) when the logical AND condition is satisfied with all input emitters in the high state resulting in transistor 30 of FIG. 3 going into the off condition, or as pointed out above, into the inverse mode of operation.

In the inverse mode of operation, the designed emitters of transistor 30 are operated as collectors and the designed collector of transistor 30 is operated as an emitter, such that the preceding, i.e. driving, logic stage becomes the collector load for the inversely operated transistor 30. Each AND gate, connected as a load to the output of a driving NOR circuit, which has its AND logical function satisified, and so has the transistor therein operating inversely, draws an inverse collector current from the NOR gate. A current is also drawn in the other case i.e. input emitters in opposite states, due to the always forward biased collector-base junction (forward biased in nearly all circumstances) facilitating passing of current between those emitters in opposite states. These are the currents to be kept low to achieve a substantial fan-out of AND gate circuits loading the NOR gate.

To keep these currents low which the transistor in an AND gate is drawing through input emitters in the high state from the preceding NOR gate requires either that the transistor itself draw little current through these emitters or that the current drawn be supplied primarily from some source other than the preceding NOR gate or both. Shorting emitter 31 to the base of transistor 30 accomplishes supplying current to high state emitters in a manner such that the transistor 30 has a source of high state emitter current other than the preceding logic state.

The current otherwise drawn through those emitters of transistor 30 which are in the high state is supplied instead through base resistor 34 and the short from the base to emitter 31. By making the effective area of emitter 31 larger than the area of emitters 32 and 33, nearly all of the current required by transistor 30 with one or more emitters in the high state will be supplied via base resistor 34 and emitter 31. Thus the AND gate of FIG. 3 provides a very substantial advantage in the logic family of the present invention by allowing an increased fan-out from a NOR gate.

This use of a bipolar transistor having an emitter shorted to a base therein in a non-inverting switching operation (where an input, in switching a transistor from on to another condition, and vice versa, goes to the same logic state as the output, i.e. both switch to the high state or both switch to the low state), as in the AND gate of FIG. 3, is to be contrasted with the use of an emitter shorted to the base in a transistor which is used in inverted switching operations (where an input, in switching a transistor from on to another condition, and vice versa, goes to the opposite logic state of the output, i.e. the input goes low as the output goes high and vice versa). When used in inverting switching operation transistors, the shorting of an emitter to the base is for the entirely different purpose of reducing charge storage, and so deep saturation, to speed up the switching rapidity of the transistor used in the inverting switching operation. An example of such use can be found in U.S. Pat. No. 3,233,125 to Buie.

Another very important advantage of the AND gate of FIG. 3 is the extreme rapidity of operation which it can achieve, a rapidity exceeding that of the preceding NOR gate. This high rapidity of operation is achieved without use of a Schottky transistor as is noted by use of the standard symbol for transistor 30 in FIG. 3 rather than a Schottky transistor symbol. This rapidity follows directly from the use of transistor 30 in a noninverting switching mode, as noted above, such that whatever saturation occurs acts to aid the switching rapidity of the transistor rather than slow it, thus obviating the need for connecting a Schottky diode from the base to the collector of the transistor. This can be understood by noting that the effective Miller capacitance in the transistor acts to slow the rapidity of switching for a transistor operating in the inverting switching mode, but acts to aid the rapidity of switching in a transistor operating in a non-inverting switching mode.

A further advantage in the use of the AND gate is that it can be smaller than the NOR gate set out above as a result of only needing to form multiple emitters in a single base region in transistor 30 with no special base region geometry required. This tends to reduce the size of transistor 30 as compared to transistors effectively having multiple bases and, as will be seen below, the use of multiple emitters also aids in reducing the layout room required in a monolithic integrated circuit by facilitating interconnection between logic gates.

Figure 4:
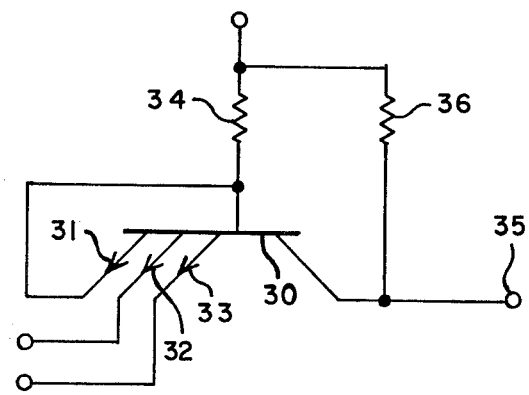
FIG. 4 shows an electrical schematic of a portion of the present invention, an AND gate.

FIG. 4 shows an improved version of the AND gate of FIG. 3, improved by the addition of a collector resistor, 36. This collector resistor primarily supplies the drive current to the load connected to the output of the AND gate of FIG. 4 when the logical AND function is satisfied at the inputs resulting in transistor 30 being in the off condition, i.e. operating in the inverse mode. This current must be supplied through base resistor 34 and the forward biased collector junction of transistor 30 in FIG. 3. In FIG. 4, base resistor 34 can be of a much larger value since most of the current supplied to the load of the logic gate in FIG. 4 is supplied through resistor 36.

Increasing base resistor 34 has a number of advantages including reducing the inverse collector current drawn by transistor 30 when it is operating in the inverse mode and in reducing the variation in the current through base resistor 34 due to changes in the supply voltage and in the $V_{BE}$ of the transistor 30. Such variations in the current in base resistor 34 lead to variations in the power consumed in the logic gate and its speed of operation. Further, the parasitic PNP transistor, occurring in the base and collector of transistor 30 plus the substrate when this logic gate is fabricated in a monolithic integrated circuit, no longer affects the current drive to the load on the logic gate of FIG. 4 connected to output 35. This is so since this current drive is now supplied through collector resistor 36. Use of collector resistor 36 also reduces the undesirable current which is supplied through the emitters of the AND gate to preceding logic gates in low logic states which are connected to those emitters of the AND gate.

Typical values for the resistors in FIG. 4 are 5,000 ohms for resistor 34 and 650 ohms for resistor 36 when 2 volts is supplied at the voltage supply terminal to which resistors 34 and 36 are connected.

Figure 5:
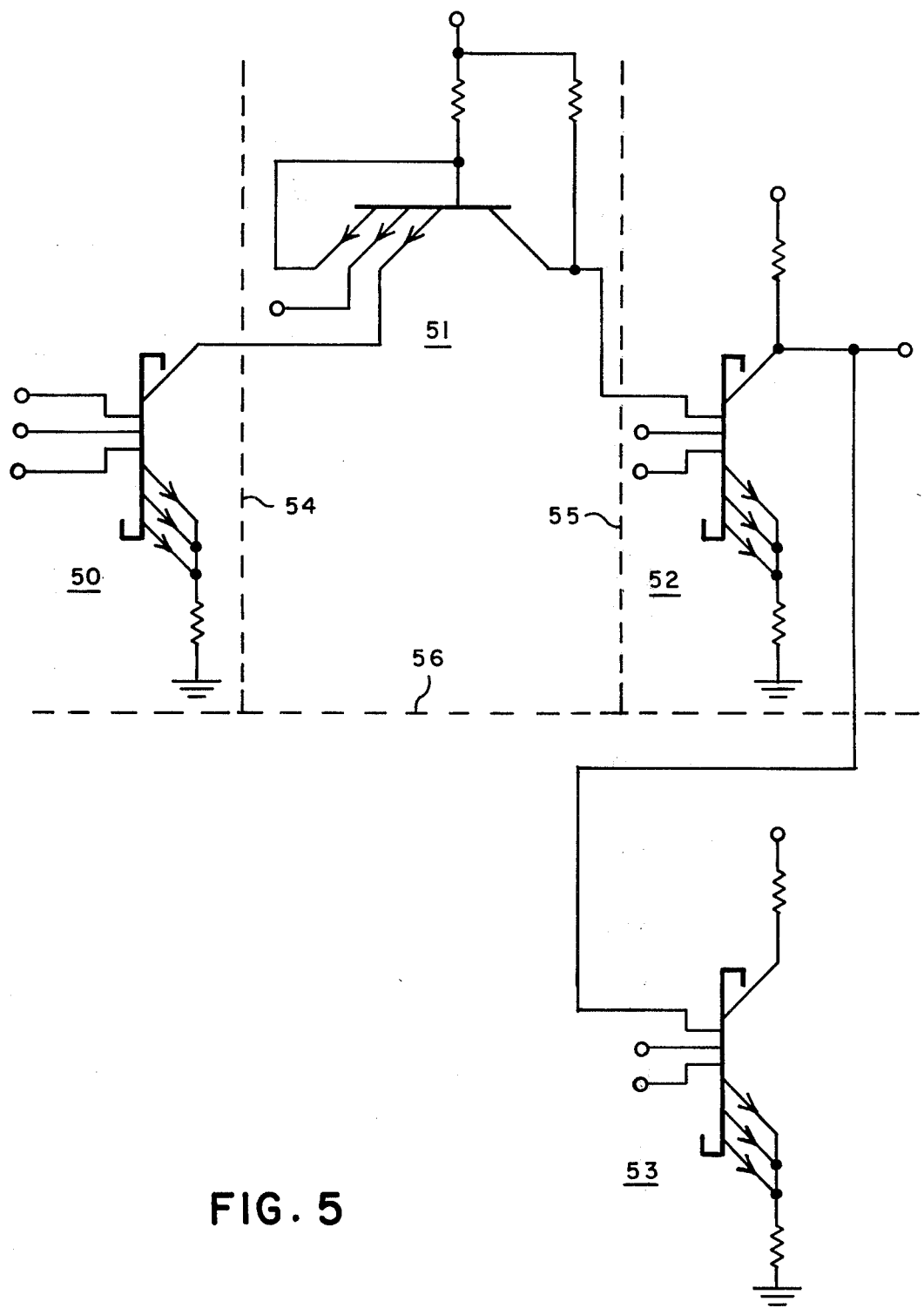
FIG. 5 shows an electrical schematic of a logic circuit of several stages using logic gates of the present invention.

Turning now to FIG. 5, a four stage logic circuit is shown using the logic gates described above, one logic gate per stage, to show some typical logic gate combinations. The four logic gates are labeled with a first gate, 50, being a NOR gate, a second gate, 51, being an AND gate, a third gate, 52, being a NOR gate and a fourth gate, 53, being a NOR gate also. Each of these logic gates are marked off from one another by dotted lines 54, 55 and 56. The logic gates shown in FIG. 5 are the NOR gate of FIG. 1 and the AND gate of FIG. 4, although the gates of FIGS. 2 and 3 could just as well have been substituted, respectively.

The only difference appearing between the gates used in FIG. 5 and the gates shown in FIGS. 1 and 4 is the omission of the collector resistor in NOR gate 50 when compared with the NOR gate of FIG. 1. Since NOR gate 50 need only sink current from AND gate 51 there is no need for a collector resistor to supply any current to AND gate 51 and so the collector resistor may be omitted to conserve space and power in a monolithic integrated circuit. As set out above, the power supplied to AND gate 51 and its load is obtained through the base and collector resistors therein.

This combination of logic gates shown in FIG. 5 allows estimating what the high and low logic state voltage levels will be for the logic gates in FIGS. 1 and 4 when these same gates are interconnected with one another and thereby serve as loads on the outputs of one another. First, consider NOR gates 52 and 53. When NOR gate 52 has its output in the low state, i.e. when the transistor in NOR gate 52 is in the on condition, clearly the transistor of NOR gate 53 is in the off condition. In this situation the voltage at the output of NOR gate 52, the same voltage obviously as that at the pertinent input of NOR gate 53, is the $V_{BE}$ drop of the transistor in NOR gate 52 minus the forward voltage drop of the Schottky diode in NOR gate 52, i.e. ($V_{BE} - V_{Sch}$), ignoring the small drop across the relatively small emitter resistor of NOR gate 52.

On the other hand, when the transistor of NOR gate 52 is in the off condition the voltage at the output of NOR gate 52, again the voltage at the pertinent input of NOR gate 53, is clamped at the $V_{BE}$ drop of NOR gate 53, ignoring the small drop across the relatively small emitter resistor of NOR gate 53. Thus, the voltage at the output of NOR gate 52 and the input of NOR gate 53 swings between the $V_{BE}$ of NOR gate 53 when the NOR gate 52 is in the high state and ($V_{BE} - V_{Sch}$) of NOR gate 52 when NOR gate 52 is in the low state.

When the transistor of AND gate 51 is in the off condition, i.e. when operating in the inverse mode, the output of AND gate 51 is in the high state and the voltage at its output, or the voltage at the input of NOR gate 52, is the $V_{BE}$ drop of NOR gate 52 ignoring the drop across the emitter resistor of that gate. In this situation the input of AND gate 51 (the output of NOR gate 50 also) is also in the high state and analysis shows that the voltage level at the juncture between these two gates is about one $V_{BE}$ drop just as it would be if NOR gate 50 were driving another NOR gate.

When the transistor of NOR gate 50 and the transistor of AND gate 51 are both in the on condition, the voltage at the juncture between these two gates is in the low state and will again by the ($V_{BE} - V_{Sch}$) drop of the transistor of NOR gate 50. The voltage at the connection between AND gate 51 and NOR gate 52 will then be above the voltage at the juncture between gates 50 and 51 by the saturation voltage of the transistor of gate 51.

As mentioned above, the old DCTL logic family was unsatisfactory because of the current-hogging problem associated therewith and that the RTL logic family evolved as a solution to this problem to provide a more usable logic family. The RTL logic family, however, suffers from disadvantages of its own due to the multiplicity of base resistors required for the logic family. These base resistors increase the component count and take up additional space as well as slowing the operation of this logic family. Nevertheless, the standard RTL gate and variants thereof have some useful properties and these gates are compatible with the logic gates of the logic family of the present invention described in connection with FIGS. 1 through 4. Some possibilities using RTL gates are shown in FIG. 6.

Figure 6:
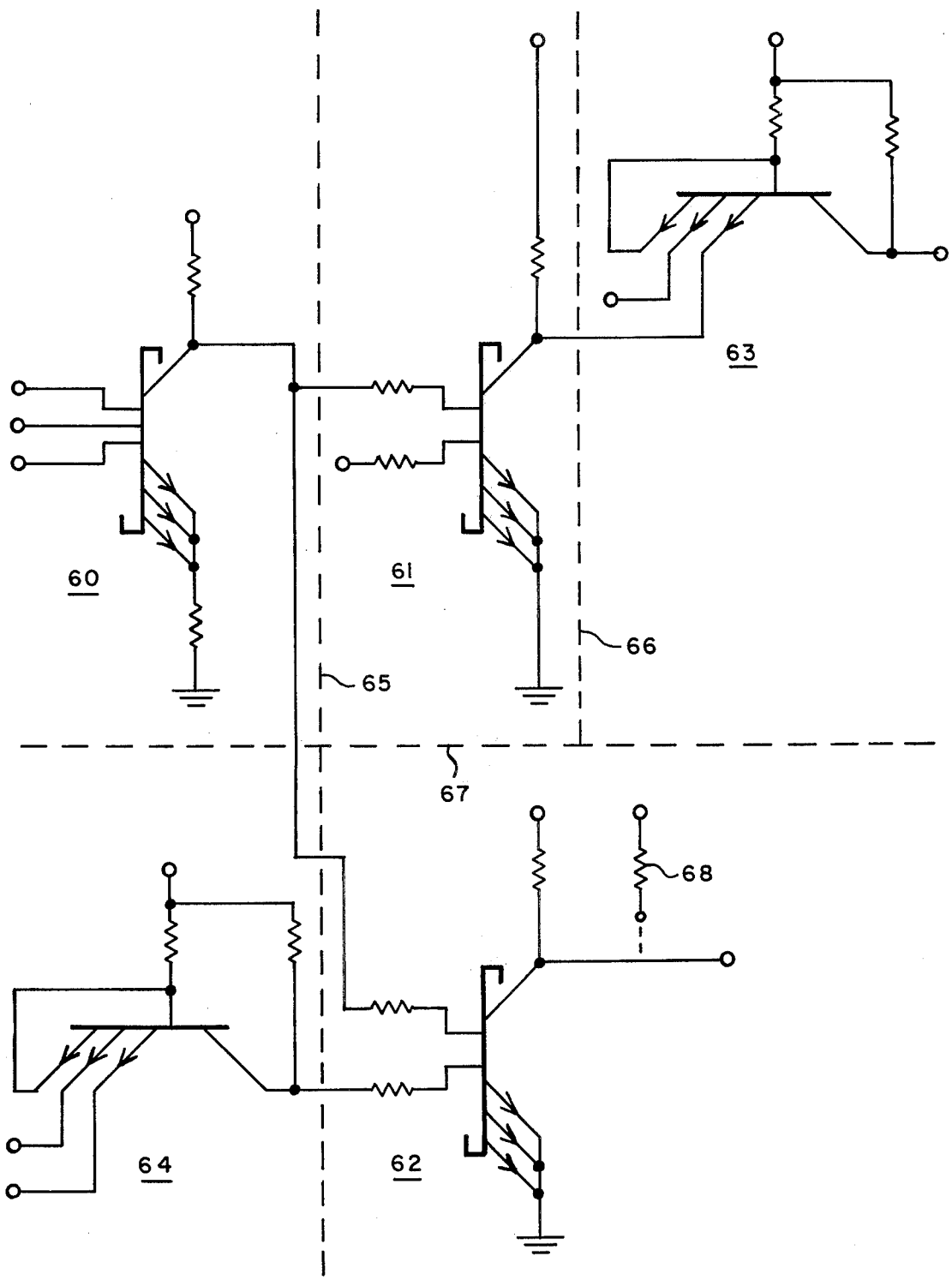
FIG. 6 shows an electrical schematic of a logic circuit of several stages using logic gates of the present invention plus certain other logic gates.

Shown in FIG. 6 is a NOR gate, 60, driving two RTL logic gates which also perform the NOR logical function, a gate 61 and a gate 62. RTL gate 61 drives an AND gate, 63, while RTL gate 62 is an output logic gate intended to drive a transmission line or some other kind of output device, to supply signals to another monolithic integrated circuit or to provide some other like function. Another AND gate, 64, is shown driving another input of RTL gate 62. Each of these logic gates is marked off from one another by dotted lines 65, 66 and 67.

The use of RTL gates 61 and 62 in the circuit of FIG. 6 overcomes a first restriction on the interconnection of logic gates of the logic family of the present invention. That is when a NOR gate of the type shown in FIGS. 1 or 2 is used to drive a plurality of similar NOR gates in parallel with one another where one or more of this plurality of NOR gates has an AND gate connected to its output in turn, a current-hogging problem arises between the second stage plurality of NOR gates. Use of the RTL gates 61 and 62, and more as needed substituted in place of the second stage plurality of nor gates of the type shown in FIGS. 1 and 2, when driven commonly by a NOR gate, solves this current-hogging problem.

A second restriction on the interconnection of logic gates of the present logic family might be noted at this point, that being that an AND gate is not to be connected to drive another AND gate if the desired Boolean logical function is to be achieved. This is not a significant restriction, however, since there is no gain in realizing the desired Boolean logic function in this manner as against operating a single AND gate with the necessary number of inputs.

Use of an RTL gate as an output has additional advantages beyond its already stated use in FIG. 6 of solving the current-hogging problem in the circumstance shown therein. First, not using an emitter resistor in gate 62 allows the low state voltage level at the output to be a minimum since removing this resistor removes any voltage drop thereacross. An an output logic stage, this emitter drop may become quite substantial since an output gate very often must sink a considerably larger current than an internal gate in many logic circuits because of the different kinds of loads which an output logic gate may be called upon to drive and the different supply voltage levels at which it may operate. The output logic gate transistor is usually a large transistor to handle this additional current.

Further, achieving compatibility with a TTL circuit used as the load for the RTL output logic gate can be accomplished without reducing the noise margins of the TTL circuit if the output gate is operated from a 5 volt supply rather than a 2 volt supply. This could be accomplished by connecting another load resistor, 68, to the collector of RTL gate 62. The other end of resistor 68 would be connected in some manner to a 5 volt supply. If the 5 volt supply were available in a monolithic integrated circuit, resistor 68 could be a resistor provided therein. Otherwise, or in the case of discrete components, resistor 68 could be an external resistor.

For the same reasons, higher current loads and compatibility with other logic families, an RTL gate may be used as an input gate to a logic circuit, in either a discrete or a monolithic integrated version. However, use of RTL gates is to be avoided wherever possible since they do increase component count, take more space in monolithic integrated circuits and slow the operation of the digital circuit. Hence, the AND gates shown in FIGS. 3 and 4 are satisfactory input circuits and where special input conditions need to be met these AND gates will typically be used.

On the matter of compatibility with other logic families, the AND gates and NOR gates of the logic family of the logic family of the present invention shown in FIGS. 1 through 4 when operated at 2 volts are compatible with TTL, but with a reduced noise margin. These logic gates are also compatible in this situation with standard ECL circuits if the high voltage supply terminal is grounded and the low voltage supply terminal is operated at a minus (−) 2 volts.

Full compatibility with standard TTL circuits, including full noise margins, can be achieved in one manner with the logic gates of the logic family of the present invention, on a monolithic integrated circuit chip to monolithic circuit chip basis, by forming a standard TTL gate at either the input, the output, or both in the monolithic integrated circuit chips used and operating the standard TTL gates at 5 volts. Other standard gates such as DTL operated at 5 volts can be provided at the inputs or outputs of a monolithic integrated circuit to again provide full compatibility. For that matter, however, the gates of the logic family of the present invention can be operated at 5 volts when they are input or output gates to achieve this same compatibility as indicated above.

Figure 7:
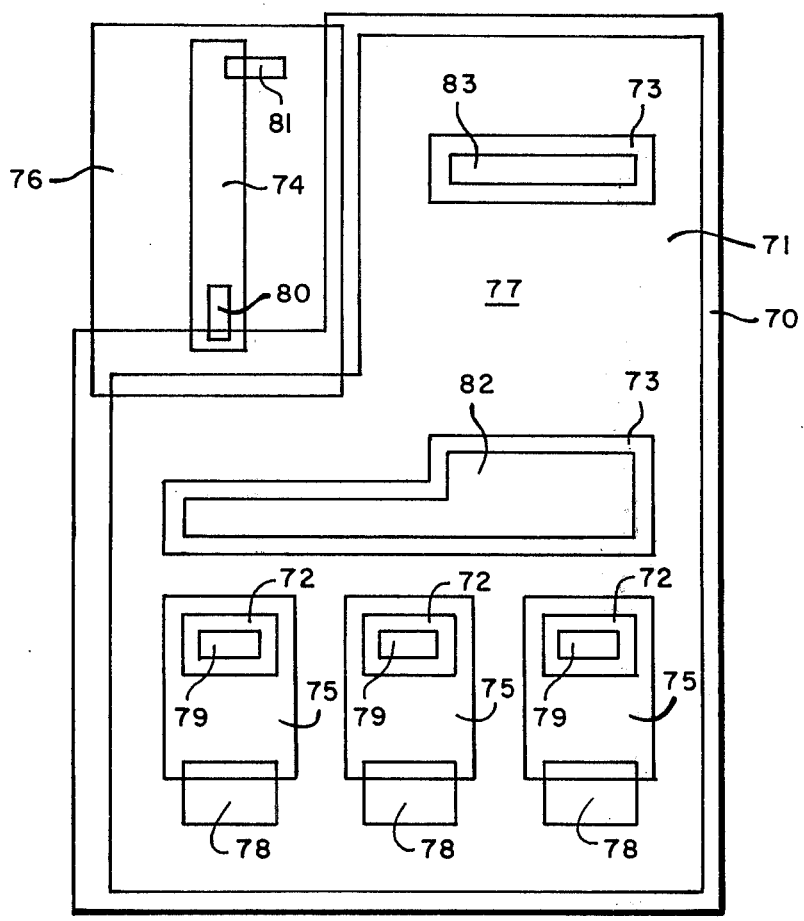
FIG. 7 shows a monolithic integrated circuit layout of a logic gate of the present invention.
Figure 8:
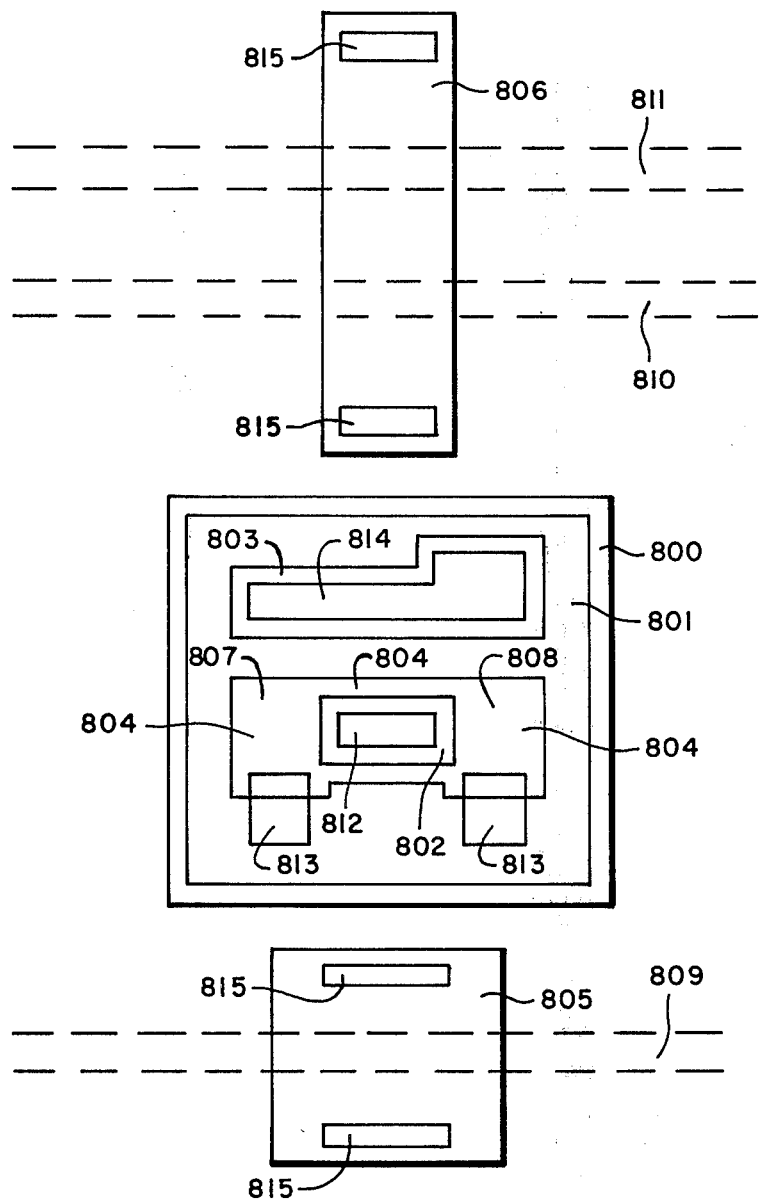
FIG. 8 shows a monolithic integrated circuit layout of a logic gate of the present invention.

FIGS. 7 and 8 are top views of two monolithic integrated circuit versions of the NOR gates in the logic family of the present invention, both views shown without metallization. Clearly, these versions can be adapted to provide discrete multiple base transistors. The gate shown in FIG. 7 corresponds to the logic gate circuit of FIG. 1. An isolating region, 70, is shown surrounding an isolated region, 71. Emitter regions of n⁺-type conductivity are provided to form transistor emitters, 72, contact regions, 73, and an emitter resistor, 74. All these regions are formed in a single n⁺ diffusion. Base regions of p-type conductivity are provided which include transistor bases, 75, and a region provided to isolate resistor 74, region 76. These regions are provided in a single p diffusion. Isolating region 70 is also of p-type conductivity and is a diffusion in an n-type epitaxial layer to form n-type isolated region 71. That portion of isolated region 71 which occurs more or less between the two contact diffusions 73, that is the region labeled 77, forms an epitaxial resistor.

Several cuts are made in the masking and protective film, typically silicon dioxide, formed over the epitaxial layer to accomodate interconnection leads to electrically connect the various aforesaid regions with one another and with other regions to form circuits. These cuts are shown here to accepts a metallization deposition or possibly to accept a doped polysilicon deposition to form these interconnections. Other interconnection means are known in the art, including diffused regions, which could also be used for interconnections.

Cuts 78 are placed to expose both the several bases 75 and the portions of the isolated region 71 across the p-n junction formed between bases 75 and isolated region 71. Upon depositing metal in these cuts, a double contact, one ohmic contact to a base 75 and one Schottky contact to the isolated region 71, is made for each of the bases 75 and an interconnection is simultaneously provided between these double contacts. This serves to form Schottky diodes, with one connected from each base 75 to isolated region 71 serving as a collector with the diode cathode connected to the isolated region 71 to thereby form a Schottky transistor.

Cuts 79 allow emitter contacts to be made which are all to be interconnected to internally short emitters 72 to one another and these shorted emitters are further to be connected to emitter resistor 74 at cut 80. Emitter resistor 74 corresponds to resistor 17 in FIG. 1. Cut 81 allows the connection of emitter resistor 74 to ground. The deposition in cut 81 will short the end of emitter resistor 74 to region 76. Region 76 is in contact with ground through its intersecting isolating region 70.

Cut 82 is the collector contact and the interconnection lead here becomes the output lead for the logic gate. Input leads are intended to extend from the metallization deposition in cuts 78. Cut 83 allows connecting to the high level voltage value supply. The region 77 which forms the epitaxial resistor corresponds to resistor 18 of FIG. 1.

The logic gate shown in FIG. 7 is constructed using a standard bipolar processing. This gate is formed in a typical epitaxial layer having approximately a 4.5 micron thickness and a .35 ohm-cm resistivity. Buried layers of the usual type are formed under portions of isolated region 71 using standard processing.

The extreme compactness of the resulting logic gate which is achievable is evident in FIG. 7. The entire area taken up on the surface of a monolithic integrated circuit chip would be less than 14 mils². This allows a very high logical function density and very rapid switching of the transistor, there being sub-nanosecond average switching times possible if the construction processes are chosen to yield suitably thin bases of a satisfactory resistivity.

FIG. 8 shows a monolithic integrated circuit version of a two input logic gate otherwise corresponding to the three input logic gate circuit diagram of FIG. 2. This monolithic integrated circuit again is formed using a standard bipolar processing technique including use of a buried layer. An isolating region, 800, again surrounds an isolated region, 801, which is formed from an n-type epitaxial layer. Emitter regions are formed by an n⁺-type diffusion and include a single transistor emitter, 802, and a contact region, 803. A p-type diffusion provides base regions which include a single transistor base, 804, an emitter resistor, 805, and a collector resistor, 806.

Two features of this arrangement should be noted. First, the transistor base 804, while a single base region, is constructed so it operationally has essentially two portions, a first portion, 807, and a second portion, 808. These portions are more or less isolated from one another by the location of emitter 802 which leaves relatively small portions of base 804 joining base portions 807 and 808. These joining portions therefore have a substantial resistance so that base portions 807 and 808 act essentially as independent bases with some resistive connection therebetween. The second feature to be noted is the ease by which "crossunders" are provided by resistors 805 and 806. This is shown by the dotted-in interconnection leads which pass over these resistor leads, 809, 810 and 811. Clearly, resistors 805 and 806 could be provided by other means such as epitaxial resistors or by doped polysilicon depositions.

Several cuts are provided in the protective covering film provided over the silicon of the epitaxial layer forming isolated region 801 for making contacts for circuit interconnections via interconnection means such as metallization. These include emitter cut 812, double contact and interconnection cuts 813 provided for making the transistor a Schottky transistor and for input lead connections, a collector contact cut 814 and resistor contact cuts 815.

Figure 9:
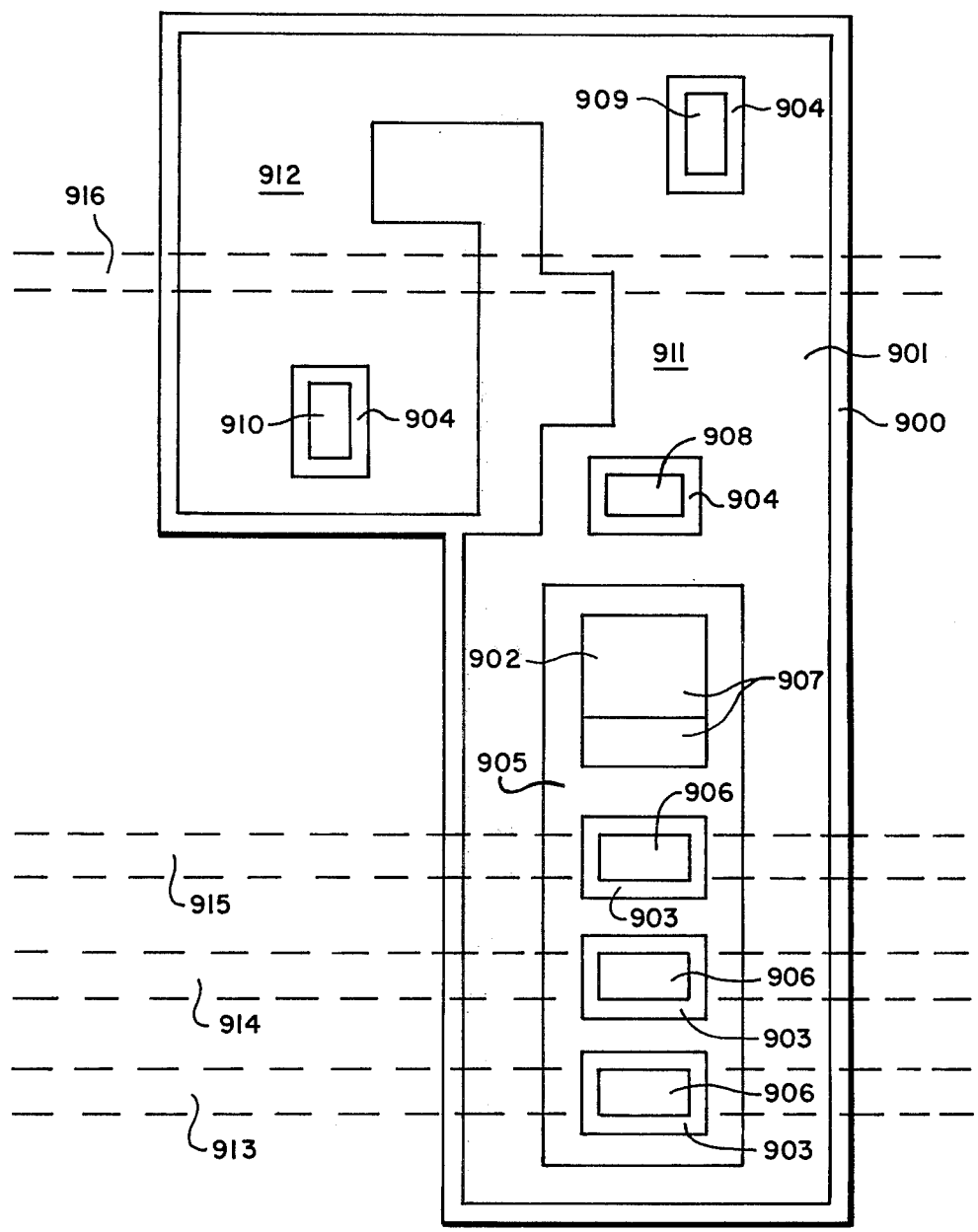
FIG. 9 shows a monolithic integrated circuit layout of a logic gate of the present invention.

FIG. 9 shows the top view of a monolithic integrated circuit corresponding to the AND gate circuit of FIG. 4, but with three inputs, constructed by standard bipolar processing. Again, no metallization or other interconnection lead means are shown. As before, a p-type isolating region, 900, is diffused into an n-type epitaxial layer to form an isolated region, 901. Emitter regions are formed by an n+-type diffusion and include an enlarged emitter, 902, and input transistor emitters, 903, and contact regions, 904. A p-type base diffusion region forms a transistor base, 905.

Once again several cuts have been made in the protective film provided over the silicon of the epitaxial layer forming isolated region 901 to permit contact to the various aforesaid regions and others by interconnection means. Three emitter contact cuts, 906, have been made for input connections. A further emitter contact cut 907 has been made which extends beyond the enlarged emitter 902 and into the base 905. A deposition in emitter cut 907 will short this larger emitter to the base by forming an ohmic contact to each and interconnecting them to reduce the input emitter current drawn by the transistor when operating with one or more emitters in the high state as set out above.

A collector contact cut, 908, is provided for an output lead connection. A high level voltage value supply contact cut, 909, allows interconnection to a terminal means adapted for energization by a voltage supply. A resistor contact cut, 910, is made to allow connection by interconnection means to the base through contact cut 907. That portion of the expitaxial layer between contact cuts 908 and 909, i.e. the portion of isolated region 901 which is labeled 911, serves as a collector resistor corresponding to resistor 36 in FIG. 4. That portion of isolated region 901 which is labeled 912 serves as a base resistor corresponding to resistor 34 in FIG. 4.

Again, the compactness of the logic gate shown in FIG. 9 is evident. Further, the dotted lines, 913, 914 and 915 representing interconnection leads, can jointly connect several of these AND gates that are similarly oriented and positioned in parallel without any interference with other interconnection lead means. This is often done where the jointly connected gates are part of a fan-out from a common driving gate. Less convenient joint interconnection possibilities exist for the gate shown in FIG. 8 since the special design required for the base region to operate effectively as several bases may limit the placement of the contact cuts 813 to some extent possibly causing some inconvenience. Connecting the logic gate inputs in FIG. 7, jointly or otherwise, can become even more difficult than for the logic gate of FIG. 8 since interconnection means must be provided between each emitter to short them internally which will tend to interfere with input lead connections.

Dotted interconnection lead 916 in FIG. 9 also illustrates the possibilities of running an interconnection lead over those portions of the logic gate containing the resistive members to effect a crossunder. Clearly, these resistive members could be provided by other means such as resistors made from base regions as in FIG. 8, pinch resistors, or by doped polysilicon. Use of one of these other means may facilitate the formation of crossunders or solve other layout problems. Use of expitaxial resistors, however, tends to save space and to reduce parasitic capacitance in monolithic integrated circuits to improve operational rapidity.

The compactness of a digital logic system constructed in a monolithic integrated circuit using the NOR gates and the AND gates of FIGS. 7, 8 and 9 or close "variants" thereof follows from the compactness of these gates individually, as described above, and from the layout convenience possible in an integrated circuit chip allowed by the use of these gates due to the geometry thereof and the possibilities they provide for making crossunders easily, again as described above. Further, the availability of two comparably performing but functionally different logic gate types, each providing a different basic logical function, and again, the layout convenience, allows a considerable amount of flexibility in providing a digital system in a monolithic integrated circuit.

In addition to the compactness, convenience and flexibility is the high performance available by use of the above described gates. The availability of average switching delays measured in the sub-nanosecond time scale and the short distances possible between the adjacent logic gates in monolithic circuit chip means a very rapid performance can be obtained. A computer simulation of the NOR gate of the present logic family, a standard ECL gate and a standard Schottky clamped TTL gate, each having two inputs, was made. Each of these gates was takes as an internal gate for a digital logic monolithic integrated circuit and each was simulated using the same component device models. The results showed the average switching delay of the NOR gate of the logic family of the present invention to be approximately half of the shortest average delay of the other two logic family gates, that being the ECL logic family NOR gate.

That a certain arbitrariness must enter into any such computer simulation and that several other factors affect the average delay time of a gate which cannot easily or reasonably be included in the simulation model which can reduce accuracy to small extent must be admitted; nevertheless, such a substantial factor of improvement in switching delay as noted above indicates that significant advantages are available in the logic family of the present invention. As a check on the impact of some of the limitations not accounted for in the computer simulation which might restrict the validity of the results of the computer simulation, a comparison has been made of a digital logic system actually provided in a monolithic integrated circuit chip in each of the foregoing logic families. The digital system chosen is an arithmetic logic unit (ALU) which appears to be about the present state of the artin providing a digital system on a chip for each of the commercially available logic families mentioned above, TTL and ECL. The logic diagram for each of these arithmetic logic unites were quite comparable.

Upon comparing, the ALU constructed from the logic family of the present invention took considerably less chip area and had a speed-power-area product, as a rough figure of merit, which was approximately half of the smaller product achieved by the next best ALU, this being the one that was constructed by gates in the ECL logic family. This result was achieved by use of transistors in the ALU constructed from gates of the logic family of the present invention having an $f_T$ which was approximately only half that of the transistor having the highest $f_T$ used in either ALU constructed from gates in the other two logic families in the comparison.

The embodiments of the invention in which an exclusive property or right is claimed are defined as follows:

1. A circuit for performing logical functions including an AND function, said circuit comprising:
    a first gate circuit comprising:
        a bipolar transistor having a first gate base, a first gate collector and a plurality of emitters therein, said emitters, including a first emitter, being inputs to receive signals from sources of signals excepting those said emitters which are directly connected to said first gate base including a second emitter so connected; and
        a first resistor connected between said first gate base and a first terminal means adapted for connection to a voltage source, whereby a logic gate circuit capable of performing said AND function is provided including said bipolar transistor as a non-inverting transistor.

2. The circuit of claim 1 wherein a second resistor is connected between said first gate collector and a second terminal means adapted for connection to a voltage source.

3. The circuit of claim 2 wherein said second terminal means is also said first terminal means.

4. The circuit of claim 1 wherein said first gate collector is directly connected to an input of a second gate circuit, said second gate circuit being capable of performing a NOR logical function.

5. The circuit of claim 1 wherein said first emitter directly is connected to an output of a second gate circuit, said second gate circuit being capable of performing a NOR logical function.

6. The circuit of claim 4 wherein said second gate circuit comprises:
    a bipolar transistor having a second gate collector, a second gate emitter and effectively a plurality of bases therein, said bases, including a first base, being inputs to receive signals from sources of signals, said first base connected as aforesaid to said first gate collector;
    a second resistor connected between said second gate emitter and a second terminal means adapted for connection to a voltage source; and
    a third resistor connected between said second gate collector and a third terminal means adapted for connection to a voltage source.

7. The circuit of claim 4 wherein said second gate circuit comprises:
    a bipolar transistor having a second gate collector, a second gate emitter and effectively a plurality of bases therein, said bases, including a first base, being inputs to receive signals from sources of signals through a plurality of base resistors, each of said base resistors being in series with one of said bases, and said first base being connected aforesaid to said first gate collector; and
    a second resistor connected between said second gate collector and a second terminal means adapted for connection to a voltage source 8. The circuit of claim 5 wherein said second gate circuit comprises:
    a bipolar transistor having a second gate collector, a second gate emitter and effectively a plurality of bases therein, said bases being inputs to receive signals from sources of signals and said second gate collector being an output connected as aforesaid to said first emitter; and
    a second resistor connected between said second gate emitter and a second terminal means adapted for connection to a voltage source.

9. The circuit of claim 5 wherein said second gate circuit comprises:
    a bipolar transistor having a second gate collector, a second gate emitter and effectively a plurality of bases therein, said basis being inputs to receive signals from sources of signals through a plurality of base resistors, each of said base resistors being in series with one of said bases, and said second gate collector being an output connected as aforesaid to said first emitter; and
    a second resistor connected between said second gate collector and a second terminal means adapted for connection to a voltage source.

10. The circuit of claim 6 wherein a fourth resistor is connected between said first gate collector and said first terminal means.

11. The circuit of claim 7 wherein a third resistor is connected between said first gate collector and said first terminal means.

12. The circuit of claim 8 wherein a third resistor is connected between said first gate collector and said first terminal means.

13. The circuit of claim 8 wherein a third resistor is connected between said second gate collector and a third terminal means adapted for connection to a voltage source.

14. The circuit of claim 9 wherein a third resistor is connected between said first gate collector and said first terminal means.

15. The circuit of claim 10 wherein a Schottky diode is connected from one of said bases to said second gate collector.

16. The circuit of claim 11 wherein a Schottky diode is connected from one of said bases to said second gate collector.

17. The circuit of claim 12 wherein a Schottky diode is connected from one of said bases to said second gate collector.

18. The circuit of claim 13 wherein a fourth resistor is connected between said first gate collector and said first terminal means.

19. The circuit of claim 14 wherein a Schottky diode is connected from one of said bases to said second gate collector.

20. The circuit of claim 18 wherein a Schottky diode is connected from one of said bases to said second gate collector.

21. A circuit for performing logical functions including a NOR function, said circuit comprising:
    a first gate circuit comprising:
        a bipolar transistor having a first gate collector, a first gate emitter and a plurality of first gate bases therein, said first gate bases being inputs to receive signals from sources of signals;

a first resistor connected between said first gate emitter and a first terminal means adapted for connection to a voltage source; and a second resistor connected between said first gate collector and a second terminal means adapted for connection to a voltage source, whereby a logic gate circuit capable of performing said NOR function is provided.

22. The circuit of claim 21 wherein an output of said first gate circuit is connected to an input of a second gate circuit capable of performing a NOR logical function, said second gate circuit comprising:

a bipolar transistor having a second gate collector, a second gate emitter and a plurality of second gate bases therein, said second gate bases being inputs to receive signals from sources of signals through a plurality of base resistors, each of said base resistors being in series with one of said second gate bases, and said first gate collector being said output and connected as aforesaid to one of said base resistors; and a third resistor connected between said second gate collector and a third terminal means adapted for connection to a voltage source.

23. The circuit of claim 21 wherein a Schottky diode is connected from one of said first gate bases to said first gate collector.

24. The circuit of claim 22 wherein a first Schottky diode is connected from one of said first gate bases to said first gate collector and a second Schottky diode is connected from one of said second gate bases to said second gate collector.

* * * * *